(12) United States Patent
Chu et al.

(10) Patent No.: US 7,396,753 B2
(45) Date of Patent: Jul. 8, 2008

(54) SEMICONDUCTOR PACKAGE SUBSTRATE HAVING BONDING PADS WITH PLATED LAYER THEREON AND PROCESS OF MANUFACTURING THE SAME

(75) Inventors: Chih-Liang Chu, Hsin-Chu (TW); E-Tung Chou, Hsin-Chu (TW); Lin-Yin Wong, Hsin-Chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 327 days.

(21) Appl. No.: 11/223,740

(22) Filed: Sep. 8, 2005

(65) Prior Publication Data

US 2006/0006422 A1   Jan. 12, 2006

Related U.S. Application Data

(62) Division of application No. 10/683,814, filed on Oct. 9, 2003, now abandoned.

(30) Foreign Application Priority Data

Nov. 25, 2002   (TW) .............. 91134161 A
Dec. 6, 2002    (TW) .............. 91135386 A

(51) Int. Cl.
*H01L 23/48* (2006.01)

(52) U.S. Cl. ...................... 438/614; 438/108
(58) Field of Classification Search ............... 438/614, 438/617, 108
See application file for complete search history.

(56) References Cited

U.S. PATENT DOCUMENTS 5,525,204 A * 6/1996 Shurboff et al. ............. 205/125

* cited by examiner

*Primary Examiner*—Leonardo Andújar
(74) *Attorney, Agent, or Firm*—Foley & Lardner LLP

(57) ABSTRACT

A semiconductor package substrate is provided having a plurality of bonding pads on at least one surface thereof and covered by a conductive film. A photoresist layer formed over the conductive film has a plurality of first openings for exposing portions of the conductive film corresponding to the bonding pads. The exposed portions of the conductive film is removed to expose the bonding pads respectively via the first openings. The exposed bonding pads are plated with a metal layer respectively. Then, the photoresist layer and the remainder of the conductive film covered by the photoresist layer are removed. A solder mask having a plurality of second openings may be formed on the surface of the substrate, and allows the plated metal layer on the bonding pads respectively to be exposed via the second openings.

7 Claims, 10 Drawing Sheets

SEMICONDUCTOR PACKAGE SUBSTRATE HAVING BONDING PADS WITH PLATED LAYER THEREON AND PROCESS OF MANUFACTURING THE SAME

CROSS REFERENCE TO RELATED APPLICATION

This application is a divisional of application Ser. No. 10/683,814 filed Oct. 9, 2003 now abandoned and claims priority of Taiwan Application No. 091134161 filed Nov. 25, 2002 and Taiwan Application No. 091135386 filed Dec. 6, 2002.

BACKGROUND OF THE INVENTION

1. Field of the Invention

The invention relates to a semiconductor package substrate having a plurality of bonding pads with a plated layer thereon, and a process of manufacturing the substrate. More particularly, the invention relates to a semiconductor package substrate in which a Ni/Au plated layer is formed on an exposed surface of a bonding pad, and a process of forming the Ni/Au plated layer on the exposed surface of the bonding pad of the semiconductor package substrate.

2. Description of the Related Art

Semiconductor package manufacturers have confronted great challenges to satisfy the requirements of product size reduction. A plurality of conductive traces, made of copper, for example, are formed on a substrate of a semiconductor package, and respectively extend to a plurality of bonding pads for signal and electrical current transmission. A Ni/Au layer is usually formed over the exposed surface of each bonding pad to improve electrical connection between gold wires, bumps or solder balls, chips or printed circuit board elements, and to further prevent oxidation of the bonding pads.

The bonding pads are the electrical contacts, for example, bump pads or presolder pads used to electrically connect a flip-chip package substrate to the chip, or a ball pad used to electrically connect the package substrate to the printed circuit board. A Ni/Au layer is usually formed over exposed surfaces of the bonding pads to prevent the bonding pads, which are usually made of copper, from oxidizing in the atmosphere.

Therefore, electrical connection of the bumps, presolder or solder balls to chips or the printed circuit board is improved.

In the prior art, the process of forming the Ni/Au layer over the bonding pads includes either chemically forming Ni/Au or electroplating Ni/Au. The chemical formation of a Ni/Au layer includes a non-electrical process such as the Nickel/Immersion Gold (EN/IG) process, which comprises electroless plating of the substrate in a Nickel bath to form a nickel layer on the bonding pad and immersion of the substrate in a gold bath to deposit a gold layer on the nickel layer. This process usually has disadvantages such as poor solderability and insufficient soldering strength, and further may form black pads and soldering with non-uniform-thickness. Soldering with non-uniform-thickness occurs when the nickel bath varies between temperature cycles. Even if the optimal operating conditions have been satisfied, the Gold layer often does not fully cover the nickel layer and thus the underlying copper layer may be externally exposed. Black pads are typically formed when the substrate is dipped in a gold bath while excessive oxidation is occurring. Specifically, gold atoms irregularly deposit on the nickel surface, resulting in a porous structure of a gold plated layer that, owing to a chemical battery effect on the underlying Nickel layer, causes continuous oxidation and aging of the underlying nickel layer. Problems such as non-uniform thickness and black pads deteriorate the connection and bonding of gold wires, solder bumps, presolder or solder balls to the bonding pads. Therefore, the reliability of the semiconductor package is reduced.

In order to avoid the above problems of chemical formation of the Nickel/Gold layer, another approach is to use the electroplating method. Referring to FIG. 1, a conventional process forms a plurality of plating wires 11 respectively on a plurality of bonding pads 10 of a semiconductor package substrate 1. A Ni/Au layer 12 is plated on the bonding pads 10 by means of the plating wires 11. However, the plating wires 11 undesirably occupy a portion of the routing area of the substrate 1, and further may generate noise due to an antenna effect when used at high frequency.

In order to solve the above problems, gold pattern plating has been proposed in the art. Referring to FIG. 2A, a conductive layer 21 is formed on either side of a substrate 2, being used to carry a semiconductor chip. A plurality of plated through holes (PTH) or blind vias (not shown) are formed through the substrate 2. A photoresist layer 22 is formed to cover a portion of the conductive layer 21 so that traces can be formed. The conductive layer serves as a path for electrical current. The conductive layer 21 not covered by the photoresist layer 22 is plated with a Ni/Au layer 23, as shown in FIG. 2B. Then, the photoresist layer 22 is removed, leaving the Ni/Au layer 23, as shown in FIG. 2C. The conductive layer 21 is patterned to form a trace layer 24 by using the Ni/Au layer 23 as an etching mask. Thereby, an exposed surface of the trace layer 24 is plated with a Ni/Au layer 23, as shown in FIG. 2D.

Although plating wires are not required in this case, the Ni/Au layer is necessary to form the whole trace layer over the bonding pads and the trace layer of the substrate. Since the material cost of the Ni/Au layer is expensive, material wastage of the Ni/Au layer increase the total production cost. Also, the solder mask subsequently formed to cover the substrate is not very compatible with the Ni/Au layer, which further reduces the reliability.

Therefore, there is a need for a simple process of manufacturing a semiconductor package substrate with a reduced cost which can avoid the problems of the prior art such as non-uniform thickness and black pads.

SUMMARY OF THE INVENTION

It is therefore an objective of the invention to provide a package substrate having a plurality of bonding pads with a plated layer thereon and a process of manufacturing the package substrate, through which a metal layer such as Ni/Au layer is plated on the exposed bonding pads to improve electrical connection of gold wires, solder bumps or solder balls to chips or printed circuit board elements and to prevent the bonding pads from oxidizing in an ambient environment.

It is another objective of the invention to provide a package substrate having a plurality of bonding pads with a plated layer thereon and a process of manufacturing the package substrate, through which problems such as non-uniform plating thickness and black pads are overcome, and the reliability of the semiconductor package is increased.

It is another objective of the invention to provide a package substrate having a plurality of bonding pads with a plated layer thereon and a process of manufacturing the package substrate in which formation of a plurality of additional plating wires on the package substrate is not required. Thereby, the available routing area is greatly increased and noise interference induced by the plating wires can be prevented.

It is another object of the invention to provide a package substrate having a plurality of bonding pads with a plated layer thereon and a process of manufacturing the package substrate in which formation of a Ni/Au layer over the whole trace layer of the substrate is not required, so that the production cost can be significantly reduced.

To achieve the above objectives, a process of manufacturing a semiconductor package substrate of the invention includes the following steps: providing a package substrate having a plurality of bonding pads on at least one surface thereof; plating the bonding pads and then forming a solder mask having a plurality of openings over the substrate to expose the bonding pads with the plated layer thereon.

The process of the invention provides a package substrate having a plurality of bonding pads on at least one surface thereof. A conductive film is formed over the substrate. A photoresist layer having a plurality of first openings is formed over the conductive film to expose the conductive film on the bonding pads. The photoresist layer optionally has an extension portion extending from an inner wall of each first opening to cover a portion of the conductive film on each bonding pad. The portion of the conductive film not covered by the photoresist layer is removed to expose the bonding pads respectively through the first openings. An electroplating process is performed to plate the exposed bonding pads to form a metal layer such as a Ni/Au layer. Then, the photoresist layer and the conductive film covered by the photoresist layer are removed. Afterwards, a solder mask is formed over the substrate. The solder mask has a plurality of second openings to expose the bonding pads with the plated layer thereon. Each second opening has a diameter that may be either smaller or larger than the size of each bonding pad.

According to the package substrate and the manufacturing process of the invention, the plated layer (such as a Ni/Au layer) covering the exposed surface of the bonding pads of the package substrate improves the electrical connection to other devices, and protects the bonding pads from oxidizing in the ambient environment. Problems such as non-uniform plating thickness and black pads thereby are overcome, and the reliability of the semiconductor package is improved. During plating a Ni/Au layer on the bonding pads, the conductive film serves as a path for electrical current to electrically connect the bonding pads on the package substrate, without the need of plating wires on the package substrate. Thereby, the available routing area is greatly increased and noise interference induced by the plating wires is avoided. Furthermore, formation of a Ni/Au layer over the whole trace layer of the substrate, which is necessary in the prior art, is not required in the invention. Thus the production cost thereby is significantly reduced.

To provide a further understanding of the invention, the following detailed description illustrates embodiments and examples of the invention, this detailed description being provided only for illustration of the invention.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE EMBODIMENTS

Figure 1:
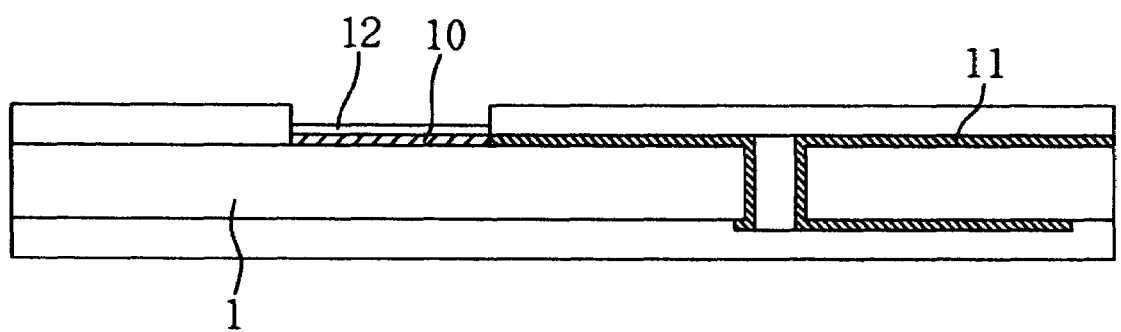
FIG. 1 (PRIOR ART) is a cross-sectional view of a conventional substrate having a bonding pad with a Ni/Au layer thereon.
Figure 2A:
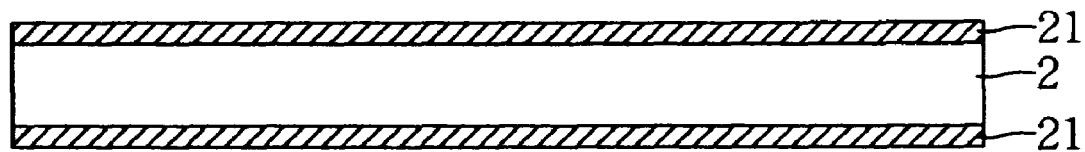
FIG. 2A to FIG. 2D (PRIOR ART) are cross-sectional views of another conventional substrate having a bonding pad with a Ni/Au layer thereon.
Figure 2B:
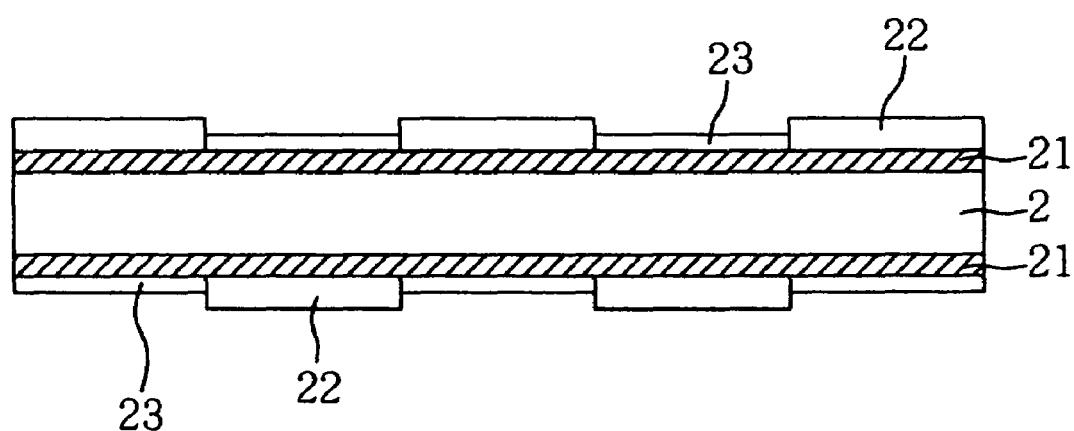
Figure 2C:
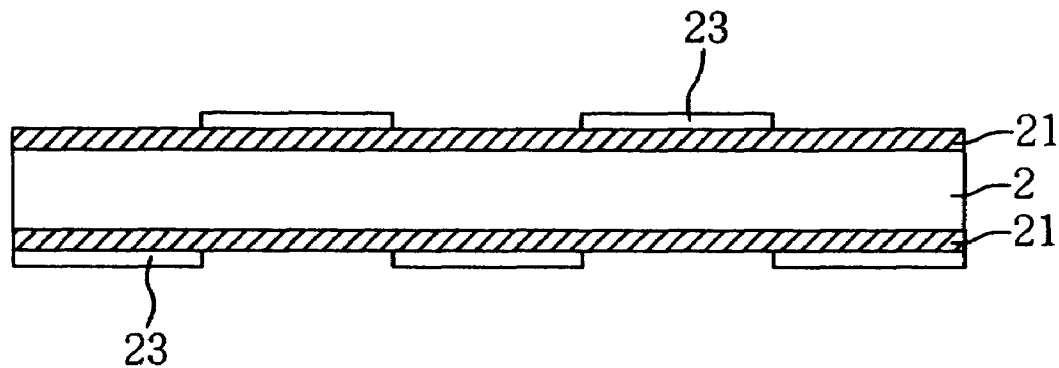
Figure 2D:
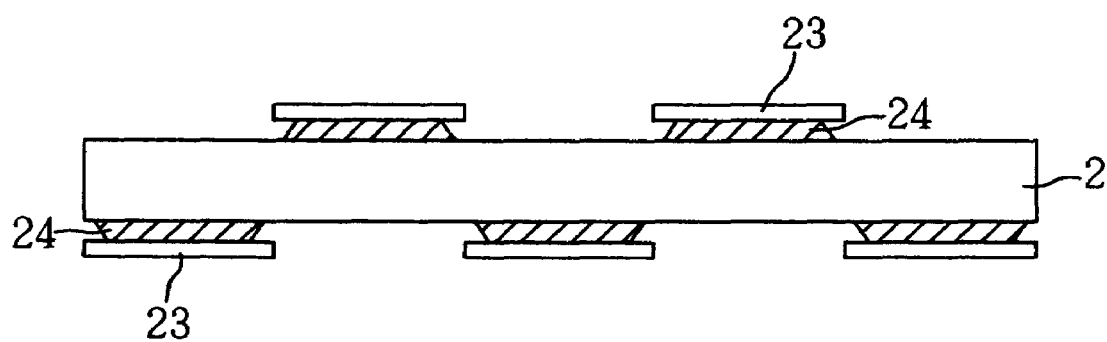

Wherever possible in the following description, like reference numerals will refer to like elements and parts unless otherwise illustrated.

Figure 3:
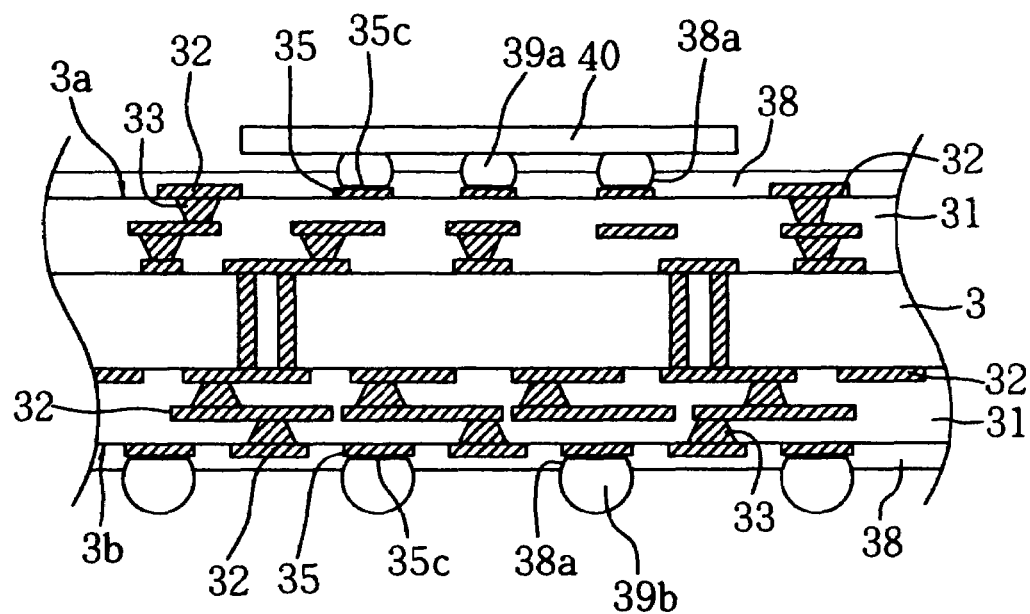
FIG. 3 is a cross-sectional view of a package substrate having a bonding pad with a plated layer thereon according to the invention.

FIG. 3 is a cross-sectional view of a bonding pad electrically connecting to a semiconductor package substrate according to one embodiment of the invention.

A semiconductor package substrate 3 is a flip-chip ball grid array (BGA) package substrate, including a plurality of insulating layers 31 alternated with trace layers 32, conductive vias 33 formed through the insulating layers to electrically connect the trace layers 32, and a solder mask 38 covering the substrate 3.

The insulating layers 31 are made of an organic material, a fiber-reinforced organic material or a particle-reinforced organic material, for example, epoxy resin, polyimide, bismaleimide triazine-based resin, or cyanate ester. Each trace layer 32 is formed by depositing a metal layer, for example copper, on one insulating layer 31, and then patterning the metal layer. An electroplating process can be optionally performed to pattern the metal layer and form the trace layer 32. A plurality of bonding pads 35 are respectively formed on the trace layers 32 on a first surface 3a and a second surface 3b of the semiconductor package substrate 3. The bonding pads 35, for example, bump pads or presolder pads, electrically connect at least one flip-chip semiconductor chip 40 to the first surface 3a of the substrate 3 through a plurality of solder bumps 39a. The bonding pads 35 on the second surface 3b of the substrate 3 can be, for example, ball pads on which a solder ball 39b is formed to electrically connect the chip 40, bonded to the substrate 3 by flip chip technology, to the printed circuit board.

A metal layer 35c is usually formed over an exposed surface of each bonding pad 35 as metallic barrier layer to protect the bonding pads 35, being made of copper, from oxidation due to being exposed to the ambient environment, and further to increase the bondability of the solder bumps 39a and the solder balls 39b with the bonding pads. The metallic barrier layer includes a Nickel adhesive layer and a gold protective layer over each bonding pad 35. The barrier layer can be formed by, for example, electroplating, electroless plating or physical vapor deposition (PVD) of a metal material such as gold, nickel, palladium, silver, tin, nickel/palladium, chromium/titanium, palladium/gold or nickel/palladium/gold. A solder mask 38 having a plurality of openings 38a is formed to cover the substrate 3, the openings 38a exposing the underlying bonding pads 35.

FIG. 4A to FIG. 4H are cross-sectional views of a bonding pad electrically connecting to a semiconductor package substrate according to a first embodiment of the invention.

Figure 4A:
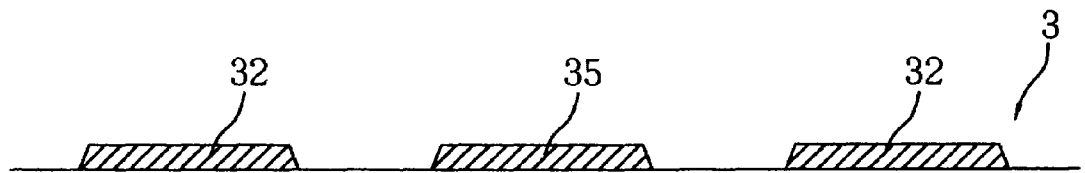
FIG. 4A to FIG. 4H are cross-sectional views of a package substrate having a bonding pad with a plated layer thereon according to a first embodiment of the invention.

Referring to FIG. 4A, a semiconductor package substrate 3 is provided. The substrate 3 can be, for example, the flip-chip package substrate as shown in FIG. 3, or a wire-bonding package substrate. The substrate 3 has been previously subjected to a front-end process. For example, a plurality of plated through holes or blind vias have been formed through the substrate 3. The trace layers 32 have been formed on the substrate 3. The trace layers 32 further may include a plurality of bonding pads 35. The process of forming the above parts is well known in the art, and its description is omitted herein.

Figure 4B:
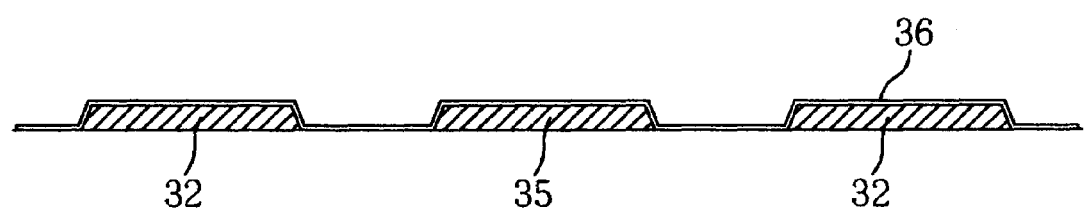
Figure 4C:
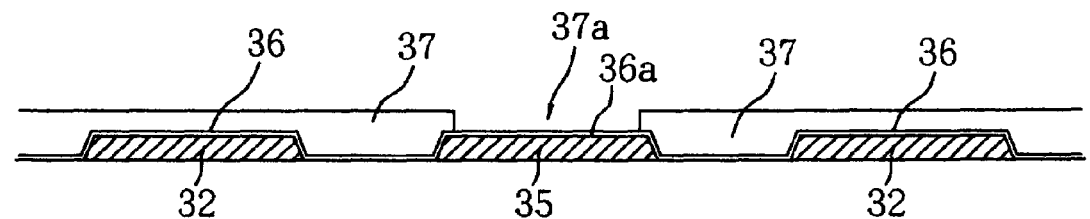

Referring to FIG. 4B, a conductive film 36 is formed over the substrate 3. The conductive film 36 serves as electric current paths for electroplating the metal layer 35c. The conductive film 36 is made of a metal selected from the group consisting of copper, tin, nickel, chromium, titanium, copper-chromium and tin-lead alloy. Preferably, the conductive film 36 is made of copper or palladium particles. The conductive film 36 forming methods include physical vapor deposition (PVD), chemical vapor deposition (CVD), electroless plating, or chemical deposition. In particular, processing methods such as sputtering, evaporation, arc vapor deposition, ion beam sputtering, laser ablation deposition or plasma enhanced chemical vapor deposition are often used to form the conductive film 36. Referring to FIG. 4C, a photoresist layer 37 is formed through printing or coating on the substrate 3 on top of the conductive film 36 thereon, through printing or coating. The photoresist layer 37 can be, for example, a dry film or liquid photoresist. The photoresist layer 37 is further formed with a plurality of opening 37a to expose the conductive film 36a on the bonding pads 35.

Figure 4D:
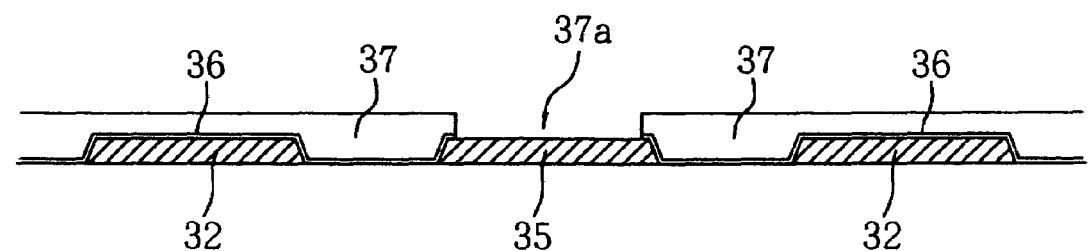

Referring to FIG. 4D, the exposed conductive film 36 is removed by etching or laser ablation to expose the bonding pads 35.

Figure 4E:
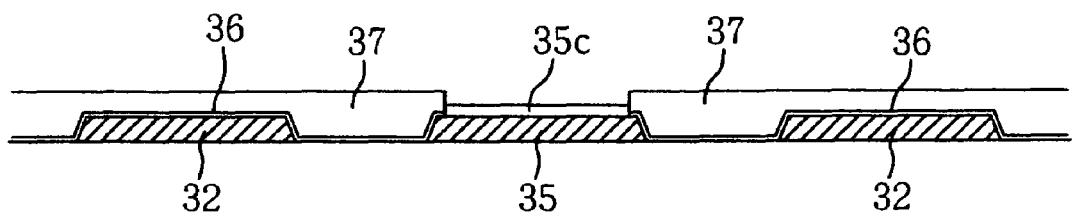

Referring to FIG. 4E, a metal layer such as gold, nickel, palladium, silver, tin, nickel/palladium, chromium/titanium, nickel/gold, palladium/gold or nickel/palladium/gold is plated on the bonding pads 35. The conductive film 36 is used as a path for electrical current during plating. The conductive film 36 is preferably formed by plating a nickel layer and then a gold layer. The nickel/gold layer can be formed to cover the exposed surface of each bonding pad 35 as a plated layer 35c. The material used in the plating process of the invention is not limited to nickel and gold. Other suitable materials used, individually or combined with one another, may also be plated directly on the exposed surface of the bonding pads 35.

Figure 4F:
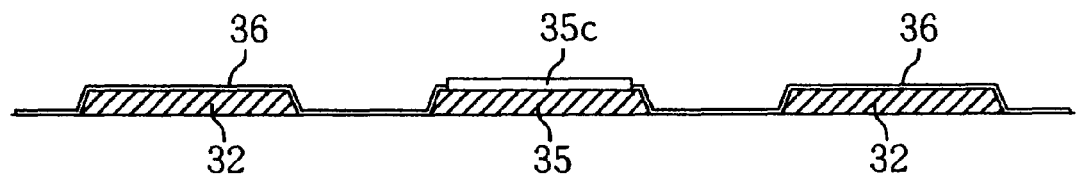
Figure 4G:
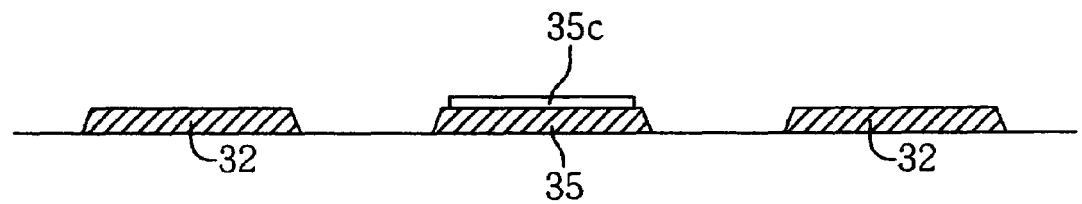

Referring to FIG. 4F, after the plated layer 35c is formed on the exposed surface of the bonding pads 35, the photoresist layer 37 and the conductive film 36 covered by the photoresist layer 37 are removed. FIG. 4G illustrates the plated layer 35c that has been formed on the exposed surface of the bonding pads 35.

Figure 4H:
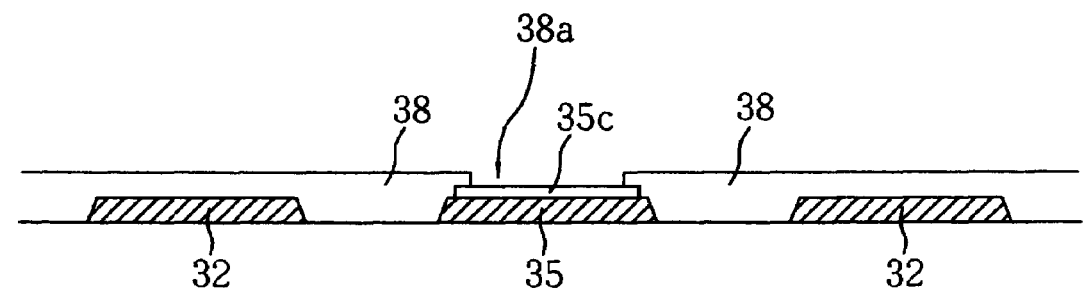

Referring to FIG. 4H, a solder mask 38, such as an electrically insulating layer, is formed over the substrate 3 for protection against contamination from the ambient environment. The solder mask 38 has a plurality of openings 38a to expose the bonding pads 35 having the plated layer 35c thereon. Each opening 38a has a diameter that may be either smaller or larger than the size of each bonding pad 35. The exposed bonding pads 35 having the plated layer 35c thereon serve as external electrical connections of the chip or circuit board.

FIG. 5A to FIG. 5I are cross-sectional views of a bonding pad formed on a semiconductor package substrate according to a second embodiment of the invention.

Figure 5A:
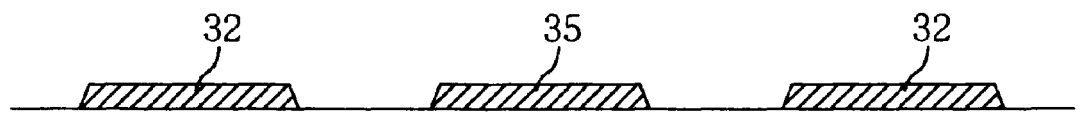
FIG. 5A to FIG. 5I are cross-sectional views of a package substrate having a bonding pad with a plated layer thereon according to a second embodiment of the invention.

Referring to FIG. 5A, a package substrate 3 is provided. The substrate 3, as describe above, can be a flip-chip package substrate 3 or a wire-bonding package substrate. The substrate 3 has been subjected to a front-end process. For example, a plurality of through holes or blind holes (not shown) are formed through the substrate 3, and at least one trace layer 32 is formed on/inside the substrate 3.

Figure 5B:
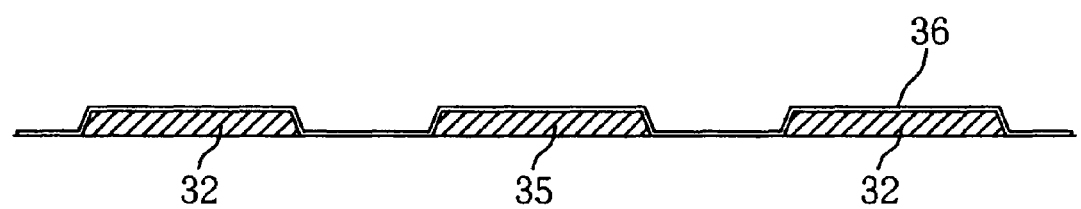

Referring to FIG. 5B, a conductive film 36 as illustrated in the first embodiment of the invention is formed over the substrate 3. The conductive film 36 serves as electric current paths for the electroplating metal layer 35c.

Figure 5C:
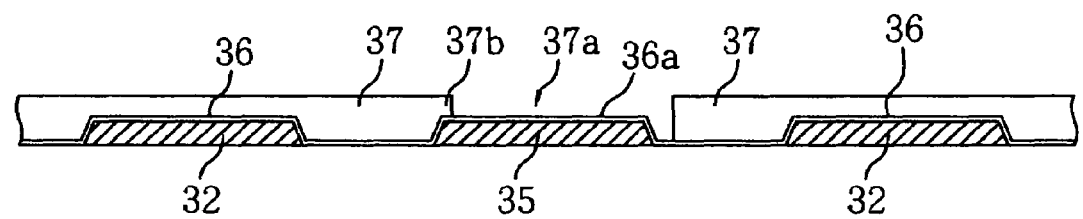
Figure 6A:
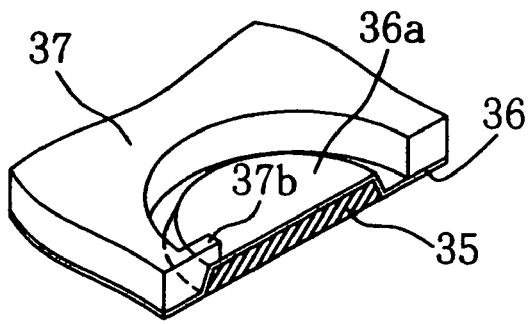
FIG. 6A is a perspective view of a package substrate having a photoresist layer to cover a conductive film thereon according to a second embodiment of the invention.

Referring to FIG. 5C, a photoresist layer 37 is formed by printing or coating over the substrate 3 on top of the conductive film 36 thereon. The photoresist layer 37 can be, for example a dry film or a liquid photoresist. The photoresist layer 37 has a plurality of openings 37a, and each of the openings 37a has an extension portion extending from an inner wall of each opening 37a to cover a portion of the conductive film 36 on each bonding pad. The remaining portion 36a of each bonding pad 35 is exposed trough the corresponding opening 37a, as shown in FIG. 6A.

Figure 5D:
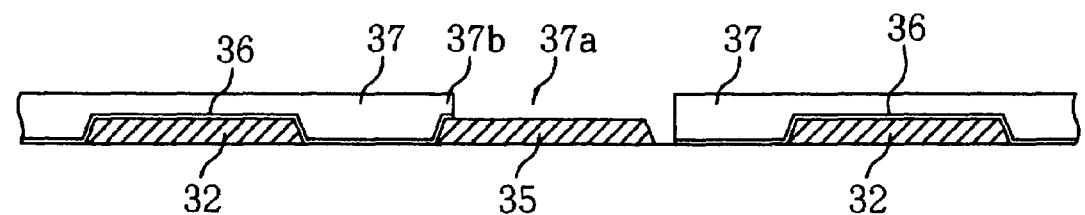

Referring to FIG. 5D, the exposed conductive film 36a that is not covered by the photoresist layer 37 is removed by etching or laser ablation. That is, the conductive film 36a covering the bonding pads 35 in the openings 37a is removed to expose the bonding pads 35 not covered by the photoresist layer 37.

Figure 5E:
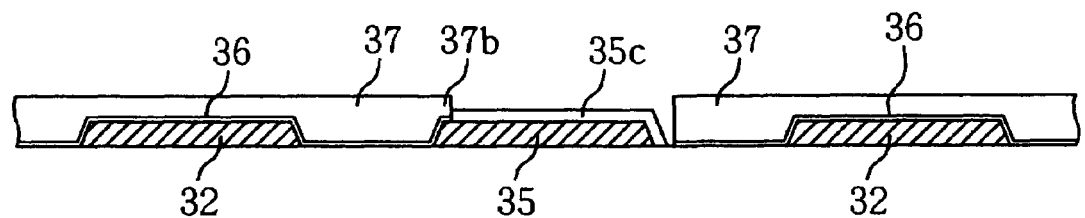

Referring to FIG. 5E, a metal layer such as gold, nickel, palladium, silver, tin, nickel/palladium, chromium/titanium, nickel/gold, palladium/gold or nickel/palladium/gold is plated on the substrate 3. The conductive film 36 is used as a path for electrical current during plating. The conductive film 36 is preferably formed through plating a nickel layer and then a gold layer. The nickel/gold layer can be formed to cover the exposed surface of each bonding pad 35 as a plated layer 35c. The material used in this plating process is not limited to nickel and Gold. Other suitable materials used, individually or combined with one another, may be directly plated on the exposed surface of the bonding pads 35.

Figure 5F:
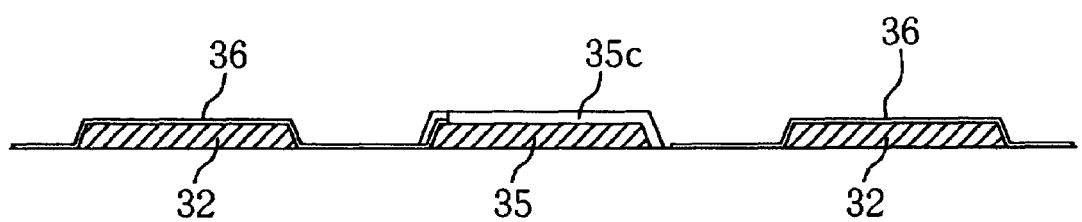
Figure 5G:
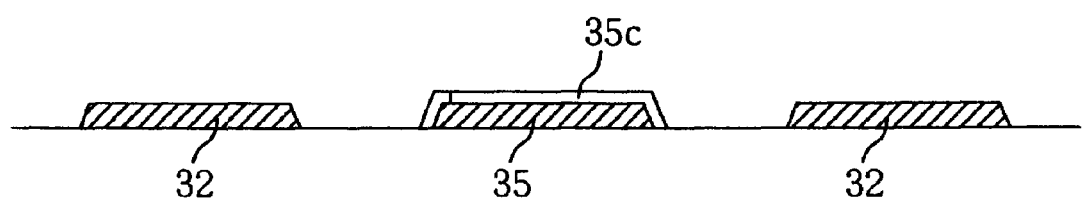
Figure 6B:
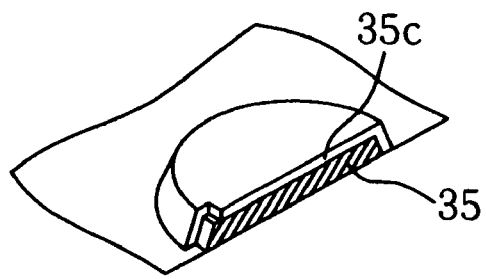
FIG. 6B is a perspective view of a package substrate having a bonding pad that is covered by a plated layer according to a second embodiment of the invention.

Referring to FIG. 5F, after the plated layer 35c has been formed on the exposed surface of the bonding pad 35, the photoresist layer 37 and the conductive film 36 covered by the photoresist layer 37 are removed. FIG. 5G illustrates the plated layer 35c that has been formed on the exposed surface of the bonding pad 35. FIG. 6B is a schematic perspective view of the plated layer 35c.

Figure 5H:
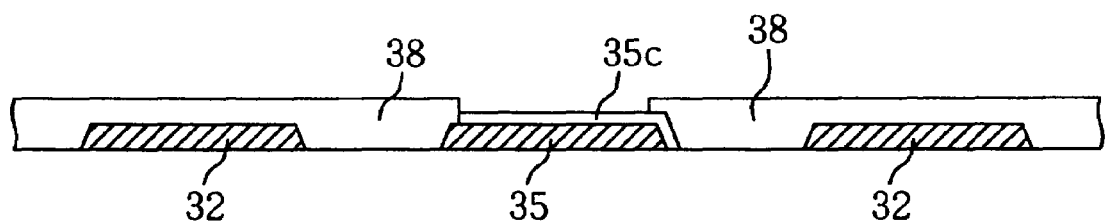
Figure 6C:
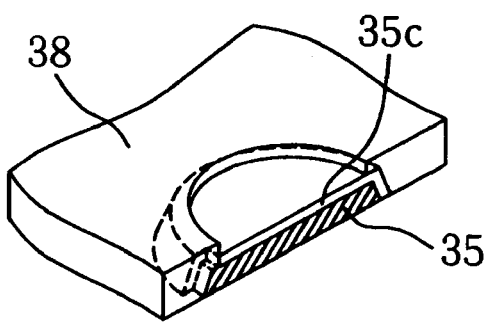
FIG. 6C and FIG. 6D are perspective views of a package substrate having a solder mask thereon according to a second embodiment of the invention.

Referring to FIG. 5H, a solder mask 38 is formed over the substrate 3 for protection against contamination in the ambient environment. The solder mask 38 has a plurality of openings 38a to expose the bonding pads 35 having the plated layer 35c thereon. Each opening 38a has a diameter that is smaller than the size of the bonding pad 35 to form a so-called solder mask defined (SMD) configuration. The exposed bonding pads 35 having the plated layer 35c thereon serve as external electrical connections of the chip or circuit board. FIG. 6C is a schematic, perspective view of the bonding pad 35.

Figure 5I:
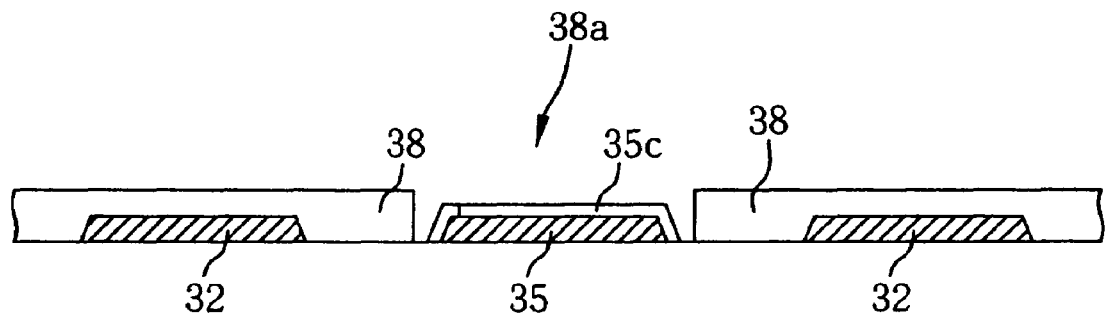
Figure 6D:
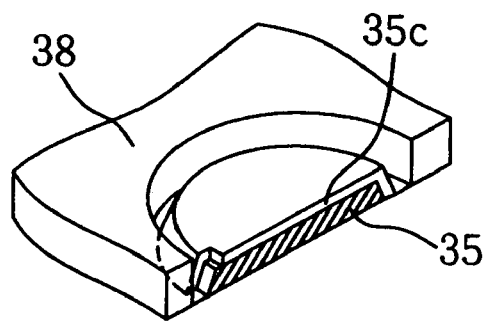

Referring to FIG. 5I, the solder mask 38 is formed over the substrate 3. The solder mask 38 has a plurality of openings 38a to expose the bonding pads 35 having the plated layer 35c thereon. Each opening 38a has a diameter larger than the size of the bonding pad 35 to form a so-called non-solder mask defined (NSMD) configuration. The exposed bonding pads 35 having the plated layer 35c thereon serve as external electrical connections of the chip or circuit board. With reference to FIG. 6D, a schematic, perspective view of the bonding pad 35 is shown.

According to the package substrate and the process of manufacturing the package substrate of the invention, the plated layer, such as a Ni/Au layer, covering the exposed surface of the bonding pads of the package substrate increases electrical connection to other devices, and protects the bonding pads from oxidizing in the ambient environment. Prior problems such as non-uniform plating thickness and black pads are also overcome to increase the reliability of the semiconductor package. During plating of a Ni/Au layer on the bonding pad, the conductive film serves as a path for electrical current to electrically connect the bonding pads on the package substrate, without the need of a plating wire on the package substrate. Thereby, the available routing area is greatly increased and noise interference induced by the plating wires is avoided. Furthermore, formation of the Ni/Au layer over the whole trace layer of the substrate is no longer required, which reduces the production cost of the package substrate.

The bonding pad of the invention can be of any type, such as a wire bonding pad, a bump pad, a presolder pad, or a ball pad. Although the above embodiment is exemplified by illustration of one bonding pad, the number of bonding pad is not limited to one. The actual number of bonding pads, electrical current paths and photoresist layers depend on the circuit design requirement. The bonding pads, the electrical current paths and the photoresist layers can be formed on one or both surfaces of the substrate.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A process of manufacturing a semiconductor package substrate having bonding pads with a plated metal layer thereon, comprising:

providing a substrate having a plurality of bonding pads on at least one surface thereof, and forming a conductive film over the surface of the substrate;

forming a photoresist layer over the conductive film, wherein the photoresist layer has a plurality of first openings corresponding in position to the bonding pads, and an extension portion extending from an inner wall of each of the first openings to partly cover a portion of the conductive film exposed via the corresponding first opening;

removing the part of the conductive film not covered by the photoresist layer, so as to expose the bonding pads respectively via the first openings;

performing a plating process to form a plated metal layer on the exposed bonding pads respectively; and removing the photoresist layer and the remainder of the conductive film covered by the photoresist layer.

2. The process of claim 1, further comprising:

forming a solder mask on the surface of the substrate, wherein the solder mask has a plurality of second openings for exposing the plated metal layer on the bonding pads respectively.

3. The process of claim 1, wherein the substrate is a flip-chip type package substrate or a wire-bonding type package substrate.

4. The process of claim 1, wherein the bonding pads are selected from the group consisting of wire-bonding pads, bump pads, presolder pads, and ball pads.

5. The process of claim 1, wherein the metal layer is made of a material selected from the group consisting of gold, nickel, palladium, silver, tin, nickel/palladium, chromium/titanium, nickel/gold, palladium/gold, and nickel/palladium/gold.

6. The process of claim 1, wherein the conductive film is made of a material selected from the group consisting of copper, tin, nickel, chromium, titanium, copper-chromium alloy, and tin-lead alloy.

7. The process of claim 1, wherein the conductive film is formed by a technique selected from the group consisting of sputtering, electroless plating, physical vapor deposition, and chemical vapor deposition.

* * * * *